(12) United States Patent
Kang

(10) Patent No.: US 10,433,443 B2
(45) Date of Patent: Oct. 1, 2019

(54) DISPLAY APPARATUS

(71) Applicant: SAMSUNG ELECTRONICS CO., LTD., Suwon-si (KR)

(72) Inventor: Jeong-il Kang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/920,925

(22) Filed: Mar. 14, 2018

(65) Prior Publication Data
US 2018/0270972 A1    Sep. 20, 2018

(30) Foreign Application Priority Data

Mar. 20, 2017  (KR) .................. 10-2017-0034794

(51) Int. Cl.
| | |
|---|---|
| G06F 1/16 | (2006.01) |
| H05K 5/00 | (2006.01) |
| H05K 5/02 | (2006.01) |
| H05K 1/02 | (2006.01) |
| H05K 5/03 | (2006.01) |
| G06F 1/18 | (2006.01) |
| G09G 3/00 | (2006.01) |
| H05K 7/00 | (2006.01) |

(Continued)

(52) U.S. Cl.
CPC ......... *H05K 5/0247* (2013.01); *G06F 1/1601* (2013.01); *G06F 1/189* (2013.01); *G09G 3/00* (2013.01); *H05K 1/028* (2013.01); *H05K 5/0017* (2013.01); *H05K 5/0217* (2013.01); *H05K 5/0234* (2013.01); *H05K 5/03* (2013.01); *A47B 81/06* (2013.01); *F16M 11/08* (2013.01); *G06F 1/166* (2013.01); *G09G 2330/00* (2013.01)

(58) Field of Classification Search
CPC ....... G06F 1/166; A47B 81/06; A47B 81/061; A47B 81/062; A47B 81/064; A47B 81/065; F16M 11/08; F16M 11/10; Y10S 248/92
USPC ......... 361/679.21, 679.22, 679.59, 749, 752, 361/756; 348/831, 836; 248/917–924
See application file for complete search history.

(56) References Cited

U.S. PATENT DOCUMENTS

| | | | | |
|---|---|---|---|---|
| 7,459,634 B2* | 12/2008 | Martin et al. | ......... | G06F 1/1603 174/97 |
| 8,094,243 B2* | 1/2012 | Yokawa | ................. | F16M 11/10 348/794 |

(Continued)

FOREIGN PATENT DOCUMENTS

| | | |
|---|---|---|
| JP | 2004-279562 A | 10/2004 |
| JP | WO2014/006996 A1 | 1/2014 |

(Continued)

OTHER PUBLICATIONS

Communication dated May 25, 2018, issued by the European Patent Office in counterpart European application No. 18159950.7.

(Continued)

*Primary Examiner* — Binh B Tran
(74) *Attorney, Agent, or Firm* — Sughrue Mion, PLLC

(57) ABSTRACT

A display apparatus is provided. The display apparatus is supplied with electrical power through an electrode panel that includes electrodes and a plate that has at least one transparency. The display apparatus is supplied with an external power through an electrode unit configured to be combined with a rear cover of the display apparatus and have a transparency.

20 Claims, 12 Drawing Sheets

(51) Int. Cl.
  *H04N 5/655* (2006.01)
  *A47B 81/06* (2006.01)
  *F16M 11/08* (2006.01)

(56) References Cited

U.S. PATENT DOCUMENTS

| | | | |
|---|---|---|---|
| 2006/0221261 A1* | 10/2006 | Ogawa et al. | H04N 5/64 348/794 |
| 2015/0170793 A1* | 6/2015 | Horii et al. | H01B 7/0823 361/679.02 |
| 2016/0173161 A1 | 6/2016 | Chai et al. | |
| 2016/0173809 A1 | 6/2016 | Millson et al. | |
| 2016/0294113 A1* | 10/2016 | Mehandjiysky et al. | G06F 1/1632 |

FOREIGN PATENT DOCUMENTS

| | | |
|---|---|---|
| KR | 10-2009-0049327 A | 5/2009 |
| KR | 10-2010-0035546 A | 4/2010 |
| WO | 2007/020542 A2 | 2/2007 |

OTHER PUBLICATIONS

Communication dated Jul. 18, 2018, issued by the European Patent Office in counterpart European application No. 18159950.7.

* cited by examiner

DISPLAY APPARATUS

CROSS-REFERENCE TO RELATED APPLICATIONS

This application claims priority from Korean Patent Application No. 10-2017-0034794, filed on Mar. 20, 2017 in the Korean Intellectual Property Office, the disclosure of which is incorporated herein by reference in its entirety.

BACKGROUND

Field

Apparatuses and methods consistent with one or more exemplary embodiments relate to a display apparatus, and more particularly, to a display apparatus that is supplied with a power through an electrode panel, which is connected to the display apparatus and has a transparency, instead of a power cable.

Description of the Related Art

A display panel capable of displaying contents in a display apparatus has recently had a high resolution and a large size.

In addition to a large size and a high resolution of a display apparatus, a thickness of the display apparatus including a display panel has become gradually thinner. An image immersion of a user may increase by virtue of the thin thickness and a short bezel of the display apparatus.

A display apparatus may be classified into a wall-mountable type display apparatus and a stand type display apparatus according to installation methods. A power cord (or a direct current (DC) adaptor) or another cable (e.g., a coaxial cable, High Definition Multimedia Interface (HDMI) cable, or the like) that supplies a power may be connected to a rear side (e.g., a rear cover) of the wall-mountable (or stand) type display apparatus.

SUMMARY

Exemplary embodiments may overcome the above disadvantages and other disadvantages not described above. Also, the present inventive concept is not required to overcome the disadvantages described above, and an exemplary embodiment of the present inventive concept may not overcome any of the problems described above.

One or more exemplary embodiments provides a display apparatus that is supplied with a power through an electrode panel, which is connected to the display apparatus and has a transparency, instead of a power cable.

According to an aspect of one or more exemplary embodiments, a display apparatus includes a display body, a wall mount configured to connect to a rear cover, which is disposed on a rear side of the display body, so as to support the display body on a wall, and an electrode section configured to combine with the rear cover so as to supply a power, wherein at least one part of the electrode section has a light transmittance that is greater than or equal to 50%.

The electrode section may include a rear cover combination portion configured to combine with the rear cover, an electrode panel configured to combine with the rear cover combination portion, and a power cord connection portion configured to combine with the electrode panel.

According to another aspect of one or more exemplary embodiments, a display apparatus includes a display body, a stand configured to combine with a bottom surface of the display body so as to support the display body, and an electrode section configured to combine with a rear cover, which is disposed on a rear side of the display body, so as to supply a power, wherein at least one part of the electrode section has a light transmittance that is greater than or equal to 50%.

A height of the electrode section supplying the power to the display body combined with the stand may be lower than a height of the electrode section supplying the power to the display body combined with a wall mount.

According to another aspect of one or more exemplary embodiments, a display apparatus includes a display body, a wall mount configured to combine with a rear cover, which is disposed on a rear side of the display body, so as to support the display body on a wall, and an electrode section that includes an electrode panel that is divided into a plurality of regions, and is configured to combine with the rear cover so as to supply a power, wherein the electrode panel has a light transmittance that is greater than or equal to 80%.

The plurality of regions of the electrode panel may include a first electrode panel configured to be not rewound and a second electrode panel configured to be rewound, wherein the first electrode panel is electrically connected to the second electrode panel.

Therefore, there may be provided a display apparatus that is supplied with a power through an electrode unit that has a transparency.

There may be provided a display apparatus that is supplied with a power through an electrode unit that has a transparency so as to extend a content viewing immersion of a user.

There may be provided a display apparatus that is supplied with a power through an electrode panel that has a transparency.

There may be provided a display apparatus that is supplied with a power through an electrode panel that has a transparency so as to extend a content viewing immersion of a user.

There may be provided a display apparatus that is supplied with a power through a plate and electrodes that have respective transparencies.

There may be provided a display apparatus that is supplied with a power through a plate and electrodes that have respective transparencies so as to extend a content viewing immersion of a user.

There may be provided a display apparatus that is supplied with a power through an electrode panel that is divided into a plurality of regions that have different respective transparencies.

There may be provided a display apparatus that is supplied with a power through an electrode panel that is divided into a plurality of regions that have different respective transparencies so as to extend a content viewing immersion of a user.

There may be provided a display apparatus that is supplied with a power through an electrode panel that is divided into a region that is rewound and a plurality of regions that are not rewound, wherein the regions have different respective transparencies.

There may be provided a display apparatus that is supplied with a power through an electrode panel that is divided into a region that is rewound and a plurality of regions that are not rewound, wherein the regions have different respective transparencies, so as to extend a content viewing immersion of a user.

According to various exemplary embodiments of one or more exemplary embodiments, a display apparatus may be supplied with one of a direct current (DC) power and an alternating current (AC) power through an electrode unit that has a transparency.

Additional and/or other aspects and advantages of one or more exemplary embodiments will be set forth in part in the description which follows and, in part, will be apparent from the description, or may be learned by practice of the one or more exemplary embodiments.

BRIEF DESCRIPTION OF THE DRAWINGS

The above and/or other aspects of the present inventive concept will be more apparent by describing certain exemplary embodiments with reference to the accompanying drawings, in which.

DETAILED DESCRIPTION OF THE EXEMPLARY EMBODIMENTS

Figure 1A:
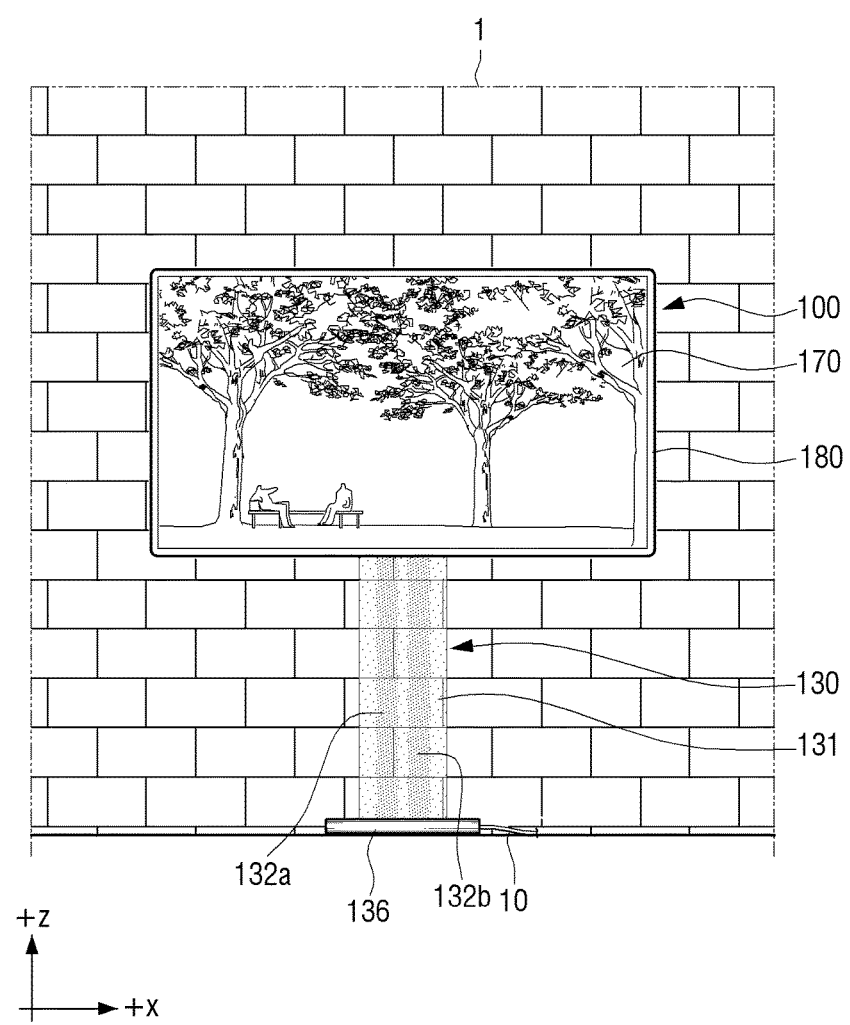
FIGS. 1A and 1B are respectively a front view and a rear view schematically illustrating a display apparatus, according to an exemplary embodiment.

Certain exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding of the present inventive concept. Thus, it is apparent that the exemplary embodiments may be carried out without those specifically defined matters. Further, well-known functions or constructions are not described in detail since they would obscure the present disclosure with unnecessary detail.

Exemplary embodiments will be described in detail with reference to the contents illustrated in the attached drawings. In addition, a method of manufacturing and using the present inventive concept will be described in detail with reference to the contents illustrated in the attached drawings. The same reference numerals or symbols respectively illustrated in the drawings denote parts or components that perform the same functions.

Although the terms, 'first', 'second', etc. may be used herein to describe various elements, these elements may not be limited by these terms. These terms are only used to distinguish one element from another. For example, a first element may be termed a second element, and, similarly, a second element may be termed a first element, without departing from the scope of exemplary embodiments. As used herein, the term "and/or," includes any and all combinations of one or more of the associated listed items.

An application refers to software that is executed in a desk-top Operating System (OS), a mobile OS, or a display OS so as to be used by a user. For example, the application may include any one or more of a word processor, a spread sheet, a contact application, a calendar application, a memo application, an alarm application, a Social Network System (SNS) application, a chatting application, a map application, a music application, and/or a video player. An application according to exemplary embodiments may refer to software that is executable in a display apparatus in response to a received user input. Further, the application according to the exemplary embodiments may refer to software that is received and downloaded from an outside of a display apparatus and then is executable in the display apparatus.

Contents may be displayed on an application executed in a display apparatus. For example, the contents may include a video file or an audio file played in a video player that includes at least one of applications, a music file played in a music player, a photo file displayed on a photo gallery, a webpage file displayed on a web browser, and the like. The contents may also include received broadcasts.

The contents may include a video file, an audio file, a text file, an image file, or a webpage that is displayed and executed on an application. In addition, the contents may include a video file and/or an audio file included in a received broadcast signal.

In the exemplary embodiments, a content may include any one or more of a video file, an audio file, a text file, an image file, or a webpage that is executed in response to a received user input (e.g., a touch or the like). Further, the term "video" may be used so as to have the same meaning as a moving picture.

The content may include an executed application screen and a user interface constituting the application screen. The content may also include one content or a plurality of contents.

In the exemplary embodiments, "a curvature is great" means that "it is considerably curved." For example, when comparing a curved line (or a curved surface) having a curvature of 1000 R and a curved line (or a curved surface) having a curvature of 4000 R, the curved line having the curvature of 1000 R may be described as "the curvature is great." The meaning "a first curvature is greater than a second curvature" means that the first curvature is more curved than the second curvature.

In the exemplary embodiments, a display apparatus may include a display apparatus having a flat screen and/or a display apparatus having a curved screen.

In the exemplary embodiments, a height of an element may be referred to as having the same meaning as a width. The height of the element may be referred to as having the same meaning as the width in response to a coordinate axis of the element.

The terminology used herein is for the purpose of describing exemplary embodiments merely and is not intended to limit and/or restrict the present inventive concept. As used herein, the singular forms are intended to include the plural forms as well, unless the context clearly indicates otherwise. It will be understood that the terms "comprises" and/or "has" when used in this specification, specify the presence of stated features, integers, steps, operations, elements, and/or components, but do not preclude the presence or addition of one or more other features, integers, steps, operations, elements, components, and/or groups thereof. The same reference numerals respectively illustrated in the drawings denote members that perform the same functions.

Figure 1B:
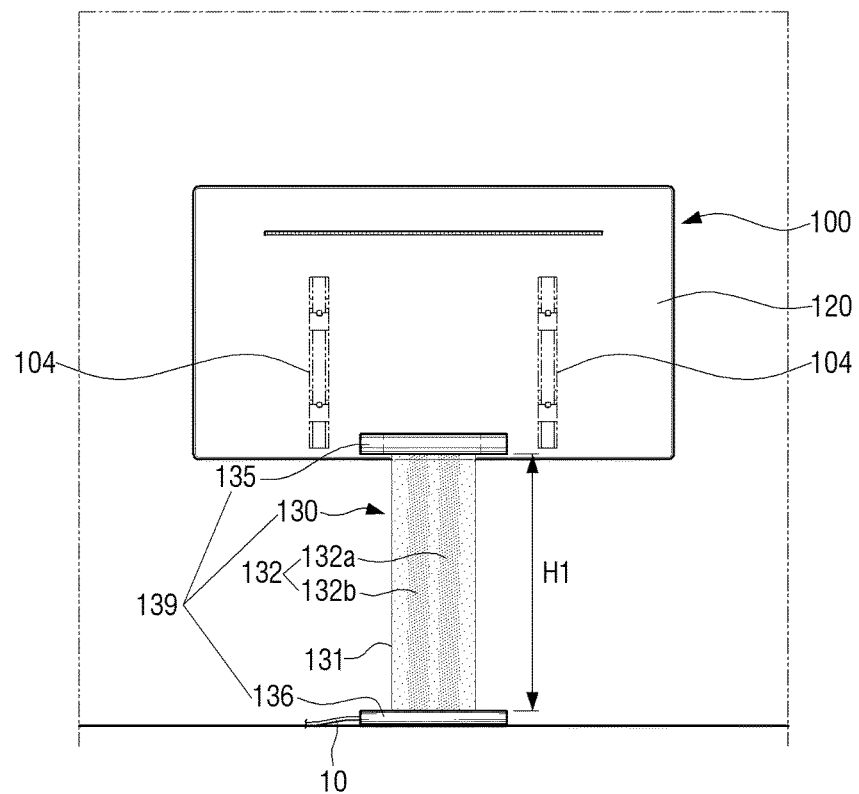

FIGS. 1A and 1B are respectively a front view and a rear view schematically illustrating a display apparatus, according to an exemplary embodiment.

Referring to FIGS. 1A and 1B, a display apparatus 100 that is a wall-mountable type and fixed to a wall 1 is illustrated. The display apparatus 100 may include a wall mount 104 that fixes the display apparatus 100 to the wall 1.

The display apparatus 100 may include a display panel 170 that displays a content, and a bottom chassis (not shown) and a top chassis 180 that support the display panel 170. A rear cover 120 may be positioned on a rear side of the display apparatus 100 (e.g., in a negative y-axis direction, referring to FIG. 1B). The display apparatus 100 from which a stand is excluded may be referred to as a display body.

An electrode panel 130 may be hung from the rear cover 120 of the display apparatus 100 toward a downward direction (e.g., in a negative z-axis direction). The electrode panel 130 may include a plate 131 and a plurality of electrodes 132 or 132a and 132b. The electrode panel 130 may have a transparency. The plate 131 may have a transparency. Further, each of the plurality of electrodes 132a and 132b may have the same transparency or different transparencies. In exemplary embodiments, a transparency may refer to a light transmittance, which is expressible as a percentage of incident light that propagates therethrough.

The electrode panel 130 may include the plate 131 having a first transparency and the plurality of electrodes 132 having a second transparency. The plurality of electrodes 132 may be positioned inside the plate 131. The plurality of electrodes 132 may have respective transparencies that correspond to the number of electrodes (e.g., a $2^{nd}a$ transparency, a $2^{nd}b$ transparency, and so forth).

The electrode panel 130 may include a rear cover combination unit (also referred to herein as a "rear cover combination portion") 135 that is combinable with the rear cover 120 and a power cord connection unit (also referred to herein as a "power cord connection portion") 136 that is connectable to (or supports) the electrode panel 130 (or the plate 131) connected to the rear cover combination unit 135. A power cord 10 may be connected to a plane of the power cord connection unit 136 (e.g., one of both sides of a cylinder (or a polyhedron)). The power cord connection unit 136 that is connected to the external power cord 10 may contact a floor of a room (or a living room, an office, or the like), or may maintain a preset distance (e.g., a preset distance lower than or equal to 30 mm) from the floor of the room (or the living room, the office, or the like).

A transparency of at least one of the rear cover combination unit 135 and the power cord connection unit 136 that are connected to the electrode panel 130 may be less than or equal to 50%. The electrode panel 130, the rear cover combination unit 135, and the power cord connection unit 136 may be collectively referred to as an electrode unit (also referred to herein as an "electrode section") 139. The electrode unit 139 including the electrode panel 130, the rear cover combination unit 135, and the power cord connection unit 136 may have a transparency (or a light transmittance). Some parts of an electrode unit (e.g., an electrode panel and the like) may have transparencies that are greater than or equal to 50%. Transparencies of elements of the electrode unit may be different from one another.

Examples of the display apparatus 100 may include an analog television (TV), a digital TV, a 3D-TV, a smart TV, a light emitting diode (LED) TV, an organic light emitting diode (OLED) TV, a plasma TV, a quantum dot light emitting diode (QLED) TV, and/or a monitor. Also, examples of the display apparatus 100 may include an electronic bulletin board and/or digital signage that has displays.

The display apparatus 100 may be realized as a flat display apparatus, a curved display apparatus having a fixed curvature screen, a flexible display apparatus having a fixed curvature screen, a bended display apparatus having a fixed curvature screen, and/or a curvature variable type display apparatus where a curvature of a current screen is variable by a received user input. It will be easily understood by persons having ordinary skill in the art that the display apparatus 100 is not limited thereto.

Figure 2A:
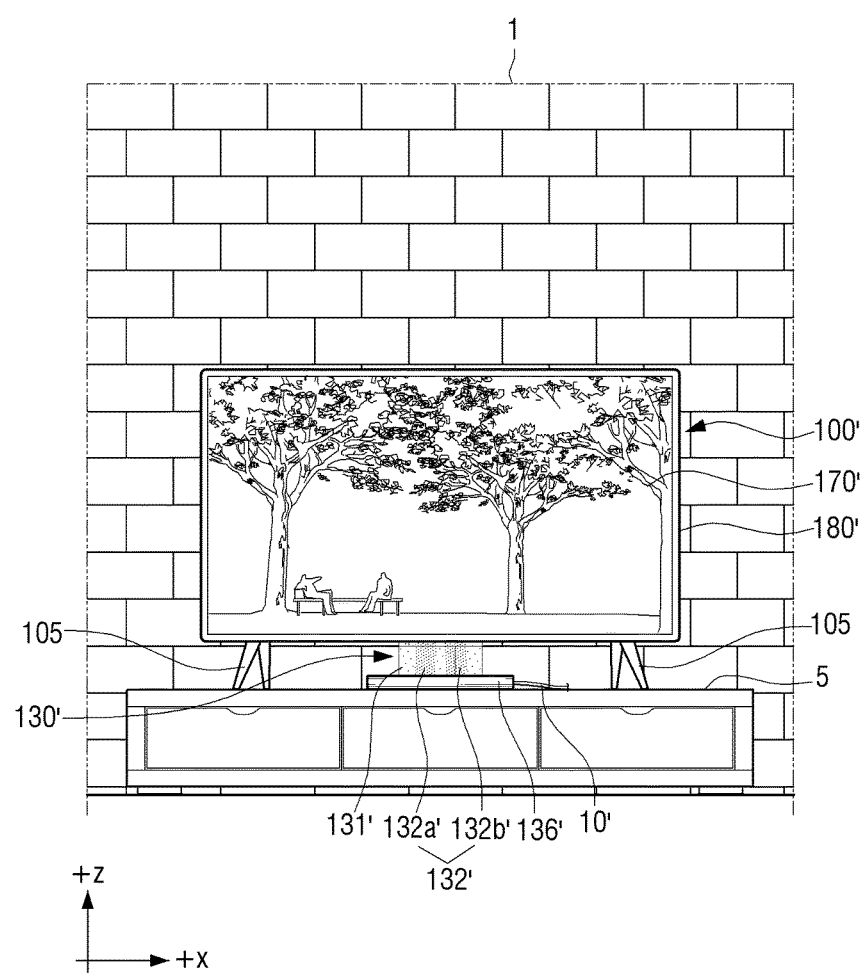
FIGS. 2A and 2B are respectively a front view and a rear view schematically illustrating a display apparatus, according to another exemplary embodiment.
Figure 2B:
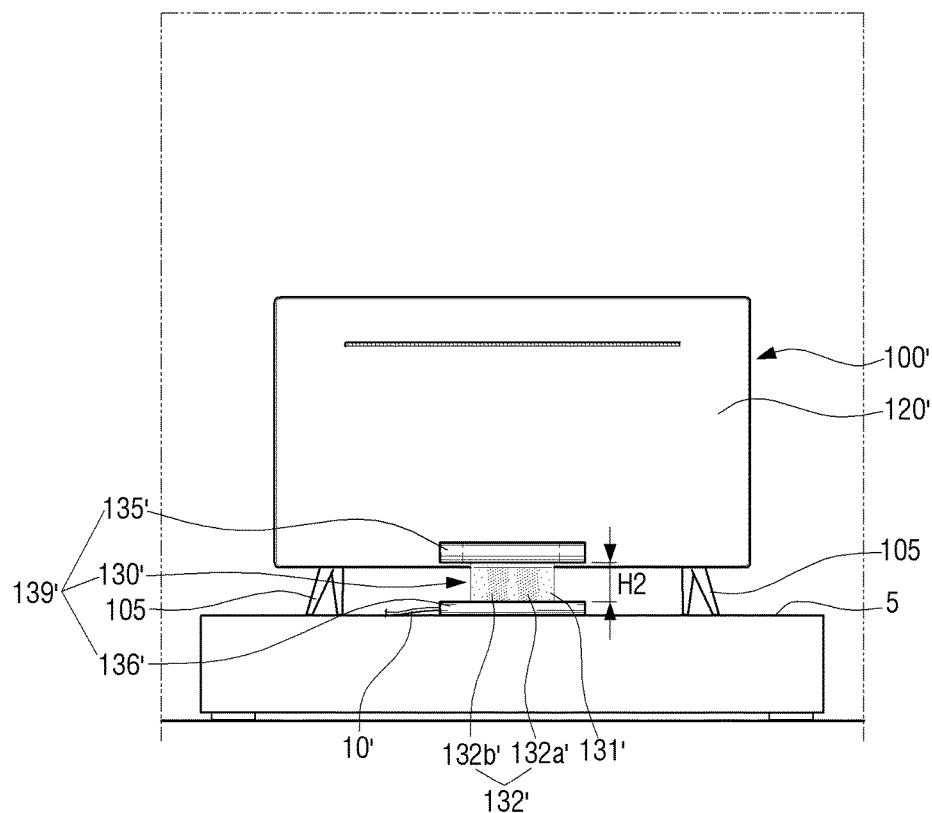

FIGS. 2A and 2B are respectively a front view and a rear view schematically illustrating a display apparatus, according to another exemplary embodiment.

Referring to FIGS. 2A and 2B, a display apparatus 100' that is a stand type may be placed on furniture 5. The display apparatus 100' includes a stand 105 that supports the display apparatus 100'. If a plurality of stands 105 are combined with the display apparatus 100', the stands 105 may be respectively combined with (or may contact) a floor surface under both sides of the display apparatus 100'. Further, if one stand 105 is combined with the display apparatus 100', the stand 105 may be combined with (or may contact) one of a rear cover 120' and the floor surface.

The display apparatus 100' may include a display panel 170' that displays a content, and a bottom chassis (not shown) and a top chassis 180' that support the display panel 170'. The rear cover 120' may be positioned on a rear side of the display apparatus 100' (e.g., in a negative y-axis direction, referring to FIG. 2B). The display apparatus 100' from which a stand is excluded may be referred to as a display body.

Similarly as described above with respect to the display apparatus 100 shown in FIGS. 1A and 1B, the display apparatus 100' shown in FIGS. 2A and 2B includes an electrode panel 130' that is hung from a lower end of the rear cover 120' toward a downward direction (e.g., in a negative z-axis direction). The electrode panel 130' may include a plate 131' and a plurality of electrodes 132' or 132a' and 132b'. The electrode panel 130' may have a transparency. The plate 131' may have a transparency. In addition, each of the plurality of electrodes 132a' and 132b' may have the same transparency or different respective transparencies.

The electrode panel 130' may include the plate 131' that has an $11^{th}$ transparency and the plurality of electrodes 132' that has a $12^{th}$ transparency. The transparency of the electrode panel 130' may be determined by the plate 131' having the $11^{th}$ transparency and the plurality of electrodes 132' having the $12^{th}$ transparency.

The electrode panel 130' may include a rear cover combination unit (also referred to herein as a "rear cover combination portion") 135' that is combinable with the rear cover 120' and a power cord connection unit (also referred to herein as a "power cord connection portion") 136' that is connectable to (or supports) the electrode panel 130' (or the plate 131') connected to the rear cover combination unit 135'. A power cord 10' may contact a plane of the power cord connection unit 136' (e.g., one of both sides of a cylinder (or a polyhedron). The power cord connection unit 136' that is connected to the external power cord 10' may contact a floor of a room (or a living room, an office, or the like) or may maintain a preset distance (e.g., lower than or equal to 15 mm) from the floor of the room (or the living room, the office, or the like).

A transparency of at least one of the rear cover combination unit 135' and the power cord connection unit 136' connected to the electrode panel 130' may be less than or equal to 50%. The electrode panel 130', the rear cover combination unit 135', and the power cord connection unit 136' may be referred to collectively as an electrode unit (also referred to herein as an "electrode section") 139'. The electrode unit 139' that includes the electrode panel 130', the rear cover combination unit 135', and the power cord connection unit 136' may have a transparency (or a light transmittance). Some parts of an electrode unit (e.g., an electrode panel and the like) may have transparencies that are greater than or equal to 50%. Transparencies of respective elements of the electrode unit may be different from one another.

A height H2 of the electrode panel 130' shown in FIG. 2B may be shorter than a height H1 of the electrode panel 130 shown in FIG. 1B. The height H1 of the electrode panel 130 of the wall-mountable type display apparatus 100 may be higher (or longer) than the height H2 of the electrode panel 130' of the stand type display apparatus 100'.

Figure 3A:
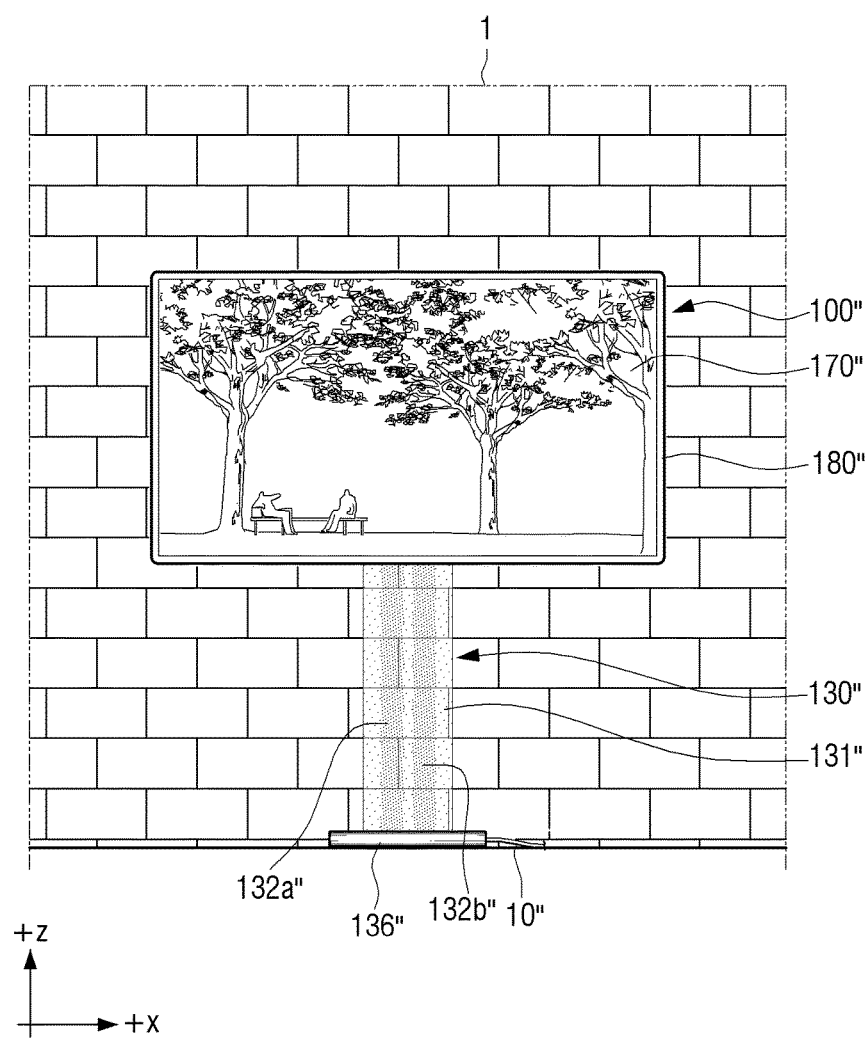
FIGS. 3A and 3B are respectively a front view and a rear view schematically illustrating a display apparatus, according to another exemplary embodiment.
Figure 3B:
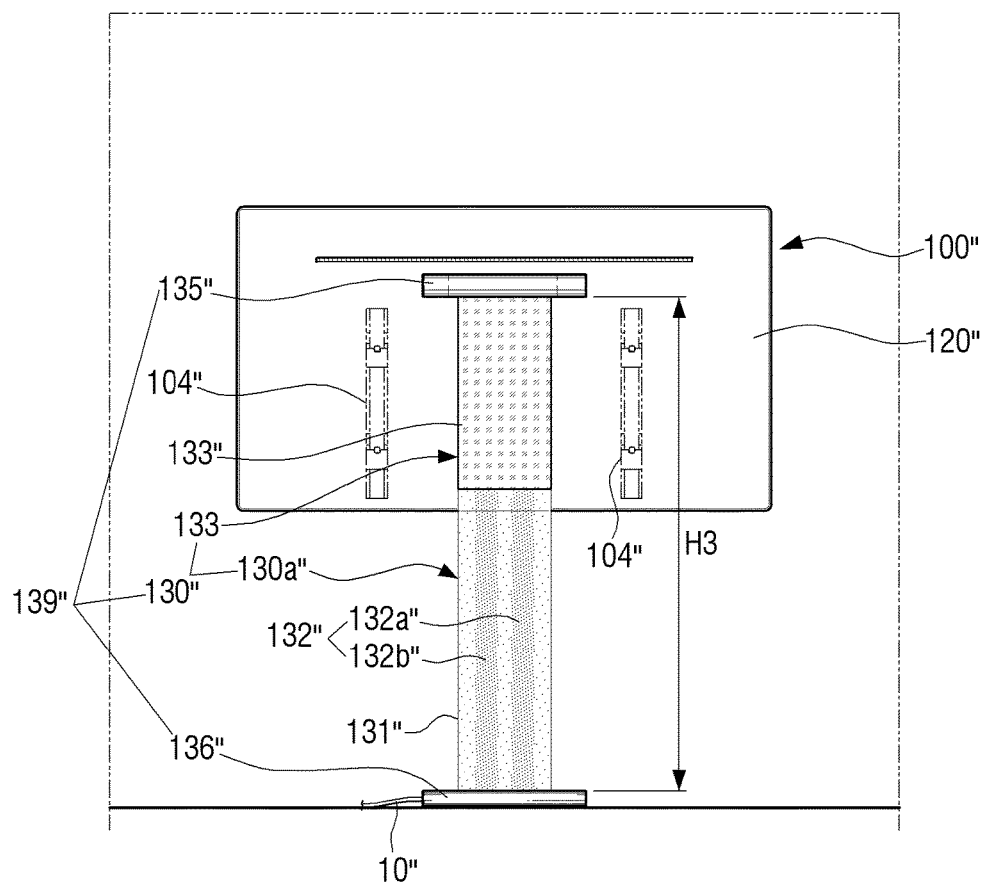

FIGS. 3A and 3B are respectively a front view and a rear view schematically illustrating a display apparatus, according to another exemplary embodiment.

Referring to FIGS. 3A and 3B, similarly as described above with respect to the display apparatus 100 shown in FIGS. 1A and 1B, a display apparatus 100" that is a wall-mountable type and fixed to a wall 1 is illustrated. The display apparatus 100" may include a wall mount 104" that fixes the display apparatus 100" to the wall 1.

The display apparatus 100" may include a display panel 170" that displays a content, and a bottom chassis (not shown) and a top chassis 180" that support the display panel 170". A rear cover 120" may be positioned on a rear side of the display apparatus 100" (e.g., in a negative y-axis direction, referring to FIG. 3B). The display apparatus 100" from which a stand is excluded may be referred to as a display body.

The display apparatus 100" includes an electrode panel 130" that includes two or more regions having different transparencies and is hung from the rear cover 120" toward a downward direction (e.g., in a negative z-axis direction).

The electrode panel 130" may include a first electrode panel 130a" that is not rewound and a second electrode panel 133 that is rewound. The first electrode panel 130a" that is not rewound may include a plate 131" and a plurality of electrodes 132" or 132a" and 132b". The second electrode panel 133 that is rewound may include a plastic (or fabric) plate 133" or 133a and 133b (referring also to FIG. 4C) that is rewound and the plurality of electrodes 132" or 132a" and 132b" (referring also to FIG. 4C).

The electrode panel 130" may include a rear cover combination unit (also referred to herein as a "rear cover combination portion") 135" that is combinable with an upper end of the rear cover 120" (e.g., a region above a central point of the rear cover 120") and a power cord connection unit (also referred to herein as a "power cord connection portion") 136" that is connectable to (or supports) the electrode panel 130" connected to the rear cover combination unit 135". In the electrode panel 130", the first electrode panel 130a" that is not rewound may be combined with the power cord connection unit 136". In addition, in the electrode panel 130", the second electrode 133 that is rewound and is connected to the first electrode panel 130a" that is not rewound may be combined with the rear cover combination unit 135".

A power cord 10" may be connected to a plane of the power cord connection unit 136" (e.g., one of both sides of a cylinder (or a polyhedron)). The power cord connection unit 136" connected to the external power cord 10" may contact a floor of a room (or a living room, an office, or the like) or may maintain a preset distance (e.g., lower than or equal to 15 mm) from the floor of the room (or the living room, the office, or the like).

A transparency of at least one of the rear cover combination unit 135" and the power cord connection unit 136" connected to the electrode panel 130" may be less than or equal to 50%. For example, the transparency of at least one of the rear cover combination unit 135" and the power cord connection unit 136" may be sufficient if printed circuit boards (PCBs) 137" and 138" (referring to FIG. 4C) of the rear cover combination unit 135" and the power cord connection unit 136" are invisible. The electrode panel 130", the rear cover combination unit 135", and the power cord connection unit 136" may be collectively referred to as an electrode unit (also referred to herein as an "electrode section") 139". The electrode unit 139" that includes the electrode panel 130", the rear cover combination unit 135", and the power cord connection unit 136" may have a transparency (or a light transmittance). Some parts of an electrode unit (e.g., an electrode panel and the like) may have transparencies that are greater than or equal to 50%. Transparencies of respective elements of the electrode unit may be different from one another.

A height H3 of the electrode panel 130" shown in FIG. 3B may be higher than the height H1 of the electrode panel 130 shown in FIG. 1B. The height H3 of the electrode panel 130" shown in FIG. 3B may be higher than the height H2 of the electrode panel 130' shown in FIG. 2B.

The height H3 of the electrode panel 130" of the wall-mountable type display apparatus 100" that has a plurality of regions may be higher than the height H1 of the electrode panel 130 of the wall-mountable type display apparatus 100. Further, the height H3 of the electrode panel 130" of the wall-mountable type display apparatus 100" that has the plurality of regions may be higher than the height H2 of the electrode panel 130' of the stand type display apparatus 100'.

Figure 4A:
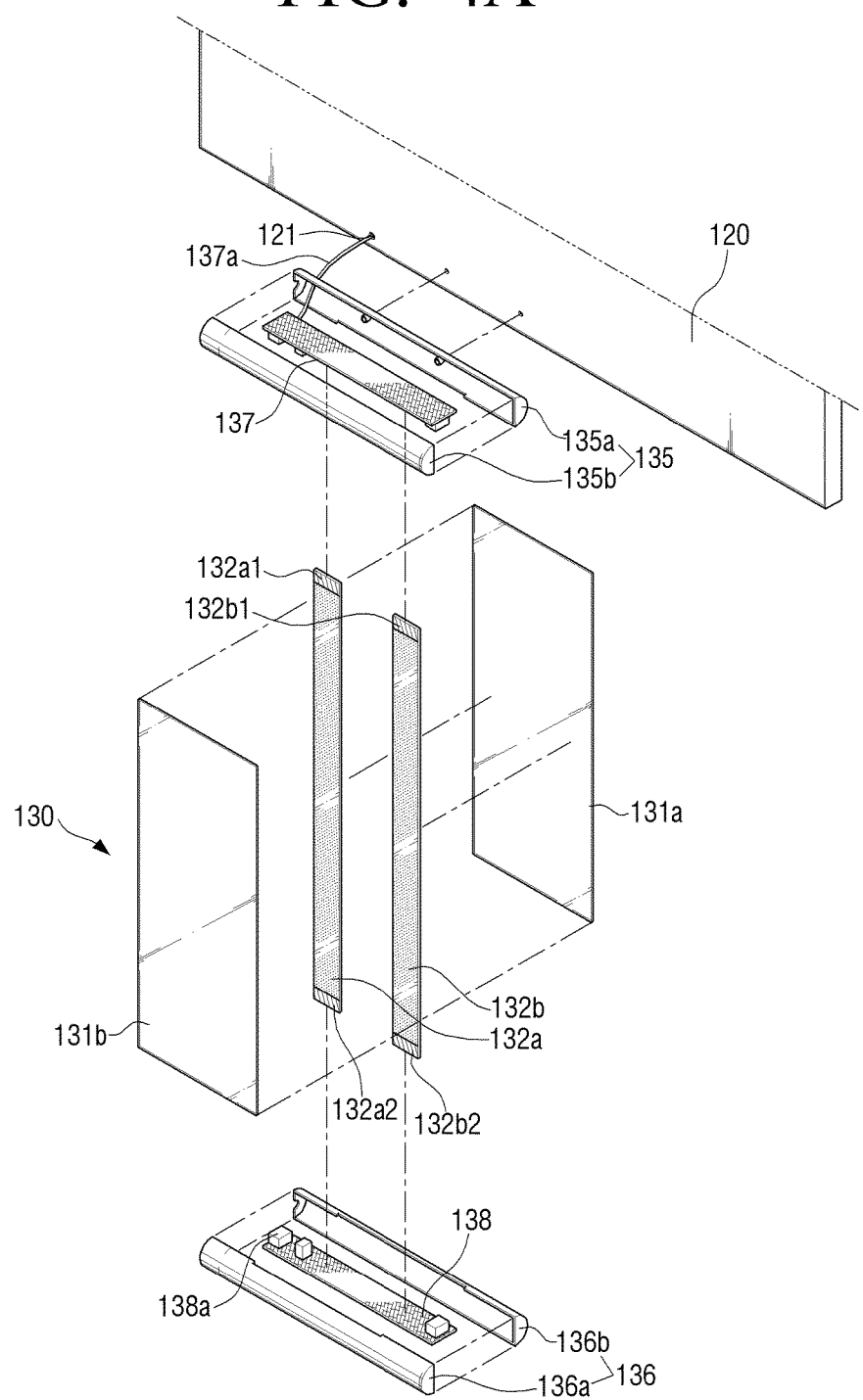
FIG. 4A is a schematic exploded perspective view illustrating a display apparatus and an electrode panel, according to an exemplary embodiment.

FIG. 4A is a schematic exploded perspective view illustrating a display apparatus and an electrode panel, according to an exemplary embodiment.

Referring to FIG. 4A, an electrode panel 130 may include a plate 131, electrodes 132, a rear cover combination unit 135, and a power cord connection unit 136. The electrode panel 130 may have a transparency (or a light transmittance). The electrode panel 130 may include the plate 131 that has a first transparency and a plurality of electrodes 132 that has a second transparency. The electrode panel 130 may have a light transmittance that is greater than or equal to 80%. The electrode panel 130 may also have a light transmittance that is greater than or equal to 50% and less than or equal to 99%.

The transparency of the electrode panel 130 may be determined by the plate 131 that has the first transparency and the plurality of electrodes 132 or 132a and 132b that has the second transparency. The transparency of the electrode panel 130 may vary based on a position thereof.

The transparency of the electrode panel 130 may be equal to or different from the first transparency of the plate 131 (e.g., a light transmittance difference may be less than or equal to ±15%). The transparency of the electrode panel 130 may be equal to or different from the second transparency of the plurality of electrodes 132 (e.g., a light transmittance difference may be less than or equal to ±15%). Further, the transparency of the electrode panel 130 may be equal to or different from a transparency of the plurality of electrodes 132 (e.g., a $2^{nd}a$ transparency of the electrode 132a, a $2^{nd}b$ transparency of the electrode 132b, a transparency greater than or equal to the transparency, and the like).

The rear cover combination unit 135 is combined with a rear cover 120. The rear cover combination unit 135 of the electrode panel 130 may be combined with a lower end of the rear cover 120 by using a fastening member (e.g., including a screw, a rivet, or an adhesive).

The rear cover combination unit 135 may include cases 135a and 135b and a PCB 137. The cases 135a and 135b of the rear cover combination unit 135 may be combined with each other by using a fastening member (e.g., including a screw, a rivet, or an adhesive).

The PCB 137 may be electrically connected to flexible PCBs 132a1 and 132b1 of the electrodes 132a and 132b. The PCB 137 may be electrically connected to the electrodes 132a and 132b via an electric wire (not shown). Additional connectors (not shown) that are connected to the flexible PCBs 132a1 and 132b1 may be positioned on the PCB 137.

A cable 137a of the PCB 137 may be inserted into an opening 121 of the rear cover 120 through an opening (not shown) of the case 135a. A power may be supplied through the cable 137a of the PCB 137.

A transparency of the rear cover combination unit 135 may be less than or equal to 50%. The transparency of the rear cover combination unit 135 may be sufficient if the PCB 137 of the rear cover combination unit 135 is invisible.

The electrodes 132 that have the second transparency may be supported by (or housed in) the plate 131 that has the first transparency. The plurality of electrodes 132a and 132b may transmit a power, which is transmitted through the power cord 10, to the PCB 137 of the rear cover combination unit 135.

The electrodes 132 may be realized as thin films of film shapes. The electrodes 132a and 132b that are realized as the thin films may be a current line and a ground, respectively.

The electrodes 132 may be realized on the plate 131a by deposition (or vacuum evaporation), adhesion, or coating so as to have the second transparency. The electrodes 132 may be realized by a method such as indium tin oxide (ITO), silver nanowire, fluorine tin oxide (FTO), metal mesh, or the like.

The electrodes 132 may have a $2^{nd}a$ transparency (corresponding to the electrode 132a) and a $2^{nd}b$ transparency (corresponding to the electrode 132b) according to the number of electrodes. The $2^{nd}a$ transparency (corresponding to the electrode 132a) may be equal to or different from the $2^{nd}b$ transparency (corresponding to the electrode 132b).

Conductivity of the electrodes 132 is lower than a conductivity of copper. Widths of the electrodes 132 (e.g., greater than or equal to 10 mm and less than or equal to 100 mm) are considerably larger than thicknesses of the electrodes 132 (e.g., less than or equal to 3 mm and greater than or equal to 3 μm) by the low conductivity (e.g., width>>thickness). Widths of the electrodes 132a and 132b are smaller than a width of the plate 131 (e.g., less than or equal to 49% of the width of the plate 131).

The electrodes 132 may be positioned between a plate 131b and a plate 131a.

The plate 131b and a film (not shown) or coating (not shown) may be positioned on front surfaces of the electrodes 132 (e.g., in a positive y-axis direction) on the plate 131a.

Materials of the plates 131a and 132b, a material of the film (not shown), and a material of the coating (not shown) may be insulator materials that are different from the materials of the electrodes 132. In particular, the plate 131b and the plate 131a may be flame retardant materials or non-combustible materials.

A transparency of the plate 131 may be equal to or different from a transparency of the electrodes 132 (e.g., a light transmittance difference may be less than or equal to ±15%).

The plate 131 may be combined with at least one of the rear cover combination unit 135 and the power cord connection unit 136 (e.g., by using a fastening member). The plate 131 may be fitted into at least one of the rear cover combination unit 135 and the power cord connection unit 136.

The power cord connection unit 136 may include cases 136a and 136b and a PCB 138. The cases 136a and 136b of the power cord connection unit 136 may be combined with each other by using a fastening member (e.g., including a screw, a rivet, or an adhesive).

The PCB 138 may be electrically connected to flexible PCBs 132a2 and 132b2 of the electrodes 132a and 132b. The PCB 138 may also be electrically connected to the electrodes 132a and 132b via an electric wire (not shown).

Additional connectors (not shown) that are connected to the flexible PCBs 132a2 and 132b2 may be positioned on the PCB 138. An external power may be supplied by a combination of the power cord 10 and a power jack 138a of the PCB 138.

A transparency of the power cord connection unit 136 may be less than or equal to 50%. The transparency of the power cord connection unit 136 may be sufficient if the PCB 138 of the power cord connection unit 136 is invisible.

An area of the plate 131a and an area of the plate 131b may be different from each other. At least one of the flexible PCBs 132a1, 132b1, 132a2, and 132b2 positioned at ends of the electrodes 132a and 132b may be exposed to an outside (e.g., in a positive y-axis direction or a negative y-axis direction) by a difference between the areas of the plates 131a and 131b.

Figure 4B:
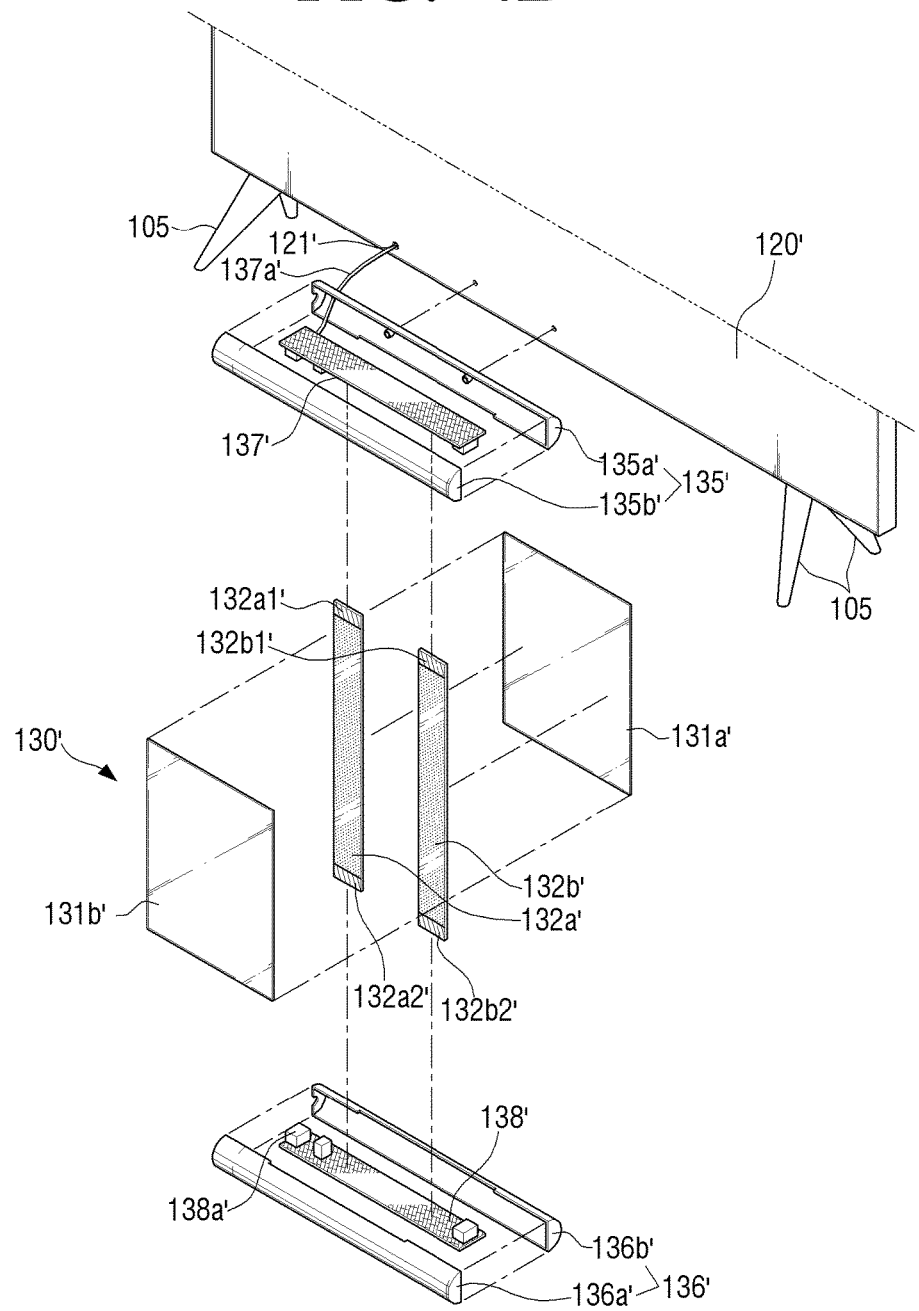
FIGS. 4B and 4C are schematic exploded perspective views illustrating a display apparatus and an electrode panel, according to another exemplary embodiment.

FIG. 4B is a schematic exploded perspective view illustrating a display apparatus and an electrode panel, according to another exemplary embodiment.

Referring to FIG. 4B, in a display apparatus 100' that is a stand type, an electrode panel 130' may include a plate 131', electrodes 132', a rear cover combination unit 135', and a power cord connection unit 136', substantially similarly to the wall-mountable type display apparatus 100 of FIG. 4A. The electrode panel 130' may have a transparency (or a light transmittance). The electrode panel 130' may include the plate 131' that has an $11^{th}$ transparency and a plurality of electrodes 132' that has a $12^{th}$ transparency. The electrode panel 130' may have a light transmittance that is greater than or equal to 80%. The electrode panel 130' may also have a light transmittance that is greater than or equal to 50% and less than or equal to 99%.

The transparency of the electrode panel 130' may be determined by the $11^{th}$ transparency of the plate 131' and the $12^{th}$ transparency of the electrodes 132' or 132a' and 132b'. The transparency of the electrode panel 130' may vary based on a position thereof.

Descriptions of the transparency of the electrode panel 130', the transparency of the plate 131', and the transparency of the electrodes 132' shown in FIG. 4B are substantially similar to the descriptions of the transparency of the electrode panel 130, the transparency of the plate 131, and the transparency of the electrodes 132 shown in FIG. 4A, and thus their repeated descriptions are omitted herein.

The rear cover combination unit 135' is combined with a rear cover 120'. The rear cover combination unit 135' of the electrode panel 130' may be combined with a lower end of the rear cover 120' by using a fastening member (e.g., including a screw, a rivet, or an adhesive).

The rear cover combination unit 135' may include cases 135*a*' and 135*b*' and a PCB 137'. The cases 135*a*' and 135*b*' of the rear cover combination unit 135' may be combined with each other by a fastening member (e.g., including a screw, a rivet, or an adhesive).

The PCB 137' may be electrically connected to flexible PCBs 132*a*1' and 132*ab*1' of the electrodes 132*a*' and 132*b*'. The PCB 137' may also be electrically connected to the electrodes 132*a*' and 132*b*' via an electric wire (not shown). Additional connectors (not shown) that are connected to the flexible PCBs 132*a*1' and 132*b*1' may be positioned on the PCB 137'.

A cable 137*a*' of the PCB 137' may be inserted into an opening 121' of the rear cover 120' through an opening (not shown) of the case 135*a*'. A power may be supplied through the cable 137*a*' of the PCB 137'.

A transparency of the rear cover combination unit 135' may be less than or equal to 50%. The transparency of the rear cover combination unit 135*a* may be sufficient if the PCB 137' of the rear cover combination unit 135*a* is invisible.

The electrodes 132' that have the $12^{th}$ transparency may be supported by (or housed in) the plate 131' that has the $11^{th}$ transparency. The plurality of electrodes 132*a*' and 132*b*' may transmit a power, which is transmitted through a power cord 10', to the display apparatus 100' via the PCB 137' of the rear cover combination unit 135'.

The electrodes 132' may be realized as thin films of film shapes. The electrodes 132*a*' and 132*b*' that are realized as thin films may be a current line and a ground, respectively.

The electrodes 132' may be realized on the plate 131*a*' by deposition (or vacuum evaporation), adhesion, or coating so as to have the $12^{th}$ transparency. The electrodes 132' may be realized by a method such as ITO, silver nanowire, FTO, metal mesh, or the like.

The electrodes 132' may have a $12^{th}a$ transparency (corresponding to the electrode 132*a*') and a $12^{th}b$ transparency (corresponding to the electrode 132*b*') according to the number of electrodes. The $12^{th}a$ transparency (corresponding to the electrode 132*a*') may be equal to or different from the $12^{th}b$ transparency (corresponding to the electrode 132*b*').

A conductivity of the electrodes 132' is lower than a conductivity of copper. Widths of the electrodes 132' (e.g., greater than or equal to 10 mm and less than or equal to 100 mm) are considerably larger than thicknesses of the electrodes 132' (e.g., less than or equal to 3 mm and greater than or equal to 3 μm) by the low conductivity (e.g., width>>thickness). Widths of the electrodes 132*a*' and 132*b*' are smaller than a width of the plate 131' (e.g., less than or equal to 49% of the width of the plate 131').

The electrodes 132' may be positioned between the plate 131*b*' and the plate 131*a*'. The plate 131*b*' and a film (not shown) or coating (not shown) may be positioned on front surfaces of the electrodes 132' on the plate 131*a*'.

Materials of the plates 131*a*' and 132*b*', a material of the film (not shown), and a material of the coating (not shown) may be insulator materials that are different from the materials of the electrodes 132'. In particular, the plate 131*b*' and the plate 131*a*' may be flame retardant materials or non-combustible materials.

The transparency of the plate 131' may be equal to or different from the transparency of the electrodes 132' (e.g., a light transmittance difference may be less than or equal to ±15%).

The plate 131' may be combined with at least one of the rear cover combination unit 135' and the power cord connection unit 136' (e.g., by a fastening member). The plate 131' may be fitted into at least one of the rear cover combination unit 135' and the power cord connection unit 136'.

The power cord connection unit 136' may include cases 136*a*' and 136*b*' and a PCB 138'. The cases 136*a*' and 136*b*' of the power cord connection unit 136' may be combined with each other by using a fastening member (e.g., including a screw, a rivet, or an adhesive).

The PCB 138' may be electrically connected to flexible PCBs 132*a*2' and 132*b*2' of the electrodes 132*a*' and 132*b*'. The PCB 138' may also be electrically connected to the electrodes 132*a*' and 132*b*' via an electric wire (not shown).

Additional connectors (not shown) that are connected to the flexible PCBs 132*a*2' and 132*b*2' may be positioned on the PCB 138'. An external power may be supplied by a combination of the power cord 10' and a power jack 138*a*' of the PCB 138'.

A transparency of the power cord connection unit 136' may be less than or equal to 50%. The transparency of the power cord connection unit 136' may be sufficient if the PCB 138' of the power cord connection unit 136' is invisible.

An area of the plate 131*a*' and an area of the plate 131*b*' may be different from each other. At least one of the flexible PCBs 132*a*1' and 132*b*1' positioned at ends of the electrodes 132*a*' and 132*b*' may be exposed to an outside (e.g., in a positive y-axis direction or a negative y-axis direction) by a difference between the areas of the plates 131*a*' and 131*b*'.

An area of the plate 131' may be different from the area of the plate 131. The area of the plate 131*b*' may be different from the area of the plate 131*b*. Further, the area of the plate 131*a*' may be different from the area of the plate 131*a*.

Figure 4C:
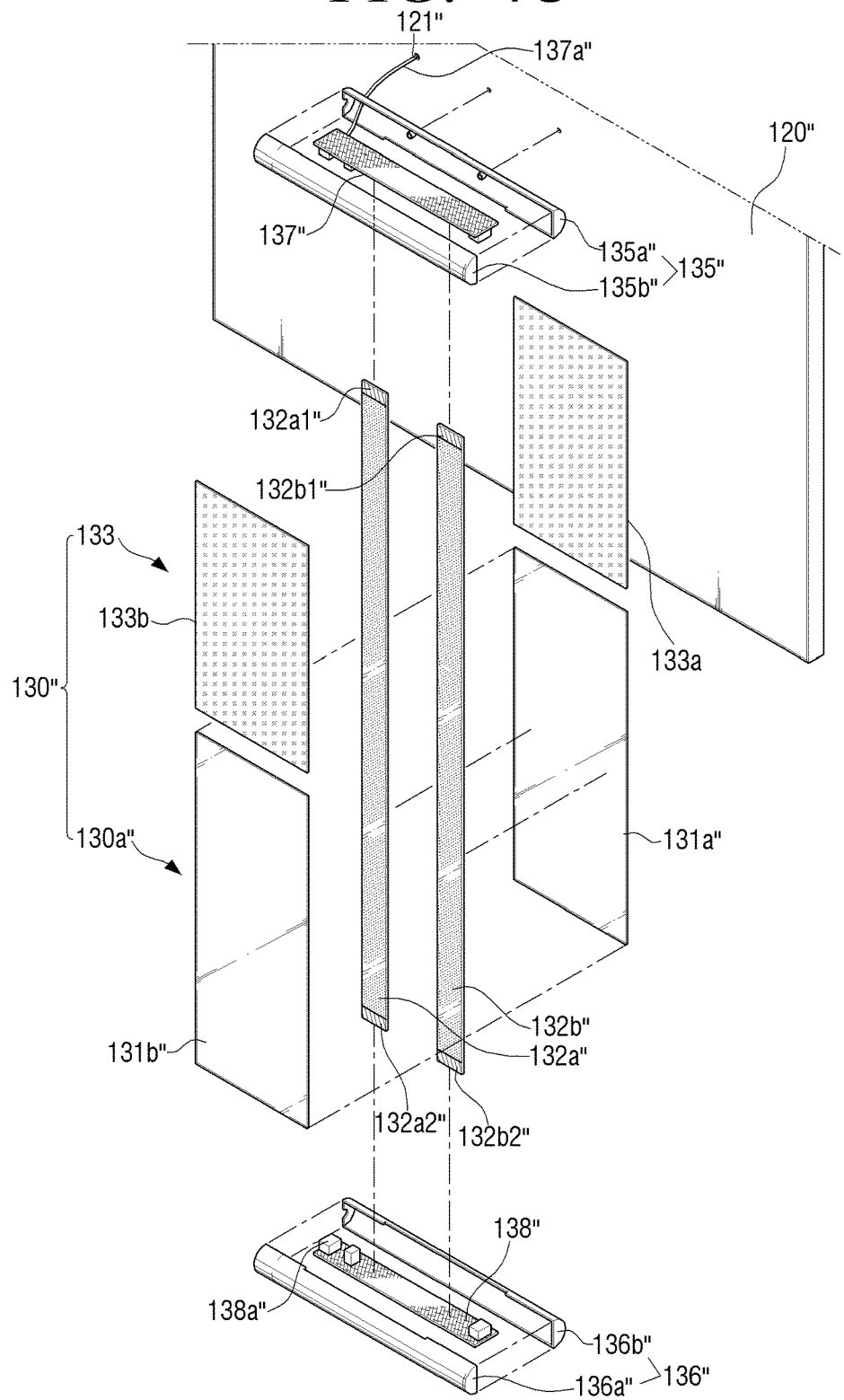

FIG. 4C is a schematic exploded perspective view illustrating a display apparatus and an electrode panel, according to another exemplary embodiment.

Referring to FIG. 4C, in a display apparatus 100" that is a wall-mountable type, an electrode panel 130" may include a plate 131", electrodes 132", a rear cover combination unit 135", and a power cord connection unit 136", substantially similarly to the wall-mountable type display apparatus 100 of FIG. 4A. The electrode panel 130" may have a transparency (or a light transmittance). The electrode panel 130" may include the plate 131" that has a $21^{st}$ transparency and a plurality of electrodes 132" that has a $22^{nd}$ transparency. The electrode panel 130" may have a light transmittance that is greater than or equal to 80%. The electrode panel 130" may also have a light transmittance that is greater than or equal to 50% and less than or equal to 99%.

By contrast with the electrode panel 130 of FIG. 4A and the electrode panel 130' of FIG. 4B, the electrode panel 130" of FIG. 4C may be realized as a plurality of electrode panels that are consecutive. One of the plurality of electrode panels may be electrically connected to the rear cover combination unit 135", and the others may be electrically connected to the power cord connection unit 136".

The electrode panel 130" may be realized as a first electrode panel 130*a*" that is not rewound and a second electrode panel 133 that is rewound. The second electrode panel 133 that is rewound may be electrically connected to the rear cover combination unit 135", and the first electrode panel 130a" that is not rewound may be electrically connected to the power cord connection unit 136".

The rear cover combination unit 135" is combined with a rear cover 120". The rear cover combination unit 135" that is connected to the second electrode panel 133 may be combined with an upper end of the rear cover 120" by using a fastening member (e.g., including a screw, a rivet, or an adhesive).

The rear cover combination unit 135" may include cases 135a" and 135b" and a PCB 137". The rear cover combination unit 135" may also include a roller (not shown) that is capable of rewinding the second electrode panel 133 connected thereto. A user may grip and pull down (e.g., in a negative z-axis direction) one of the first electrode 130a", which is connected to the second electrode 133 rewound on the roller of the rear cover combination unit 135", and the power cord connection unit 136", which is connected to the first electrode panel 130a".

The second electrode 133 that is rewound on the roller may be unwound by a gripping action of the user. A length of the electrode panel 130" may increase by unwinding of the second electrode 133 that is rewound (e.g., in comparison with a length of the electrode panel 130" when the second electrode panel 133 is rewound).

The rear cover combination unit 135" may include a roller (not shown) that is capable of rewinding the second electrode panel 133 connected to the rear cover combination unit 135" and a motor (not shown) that provides driving power for rotating the roller. The roller may rotate in a clockwise direction or a counterclockwise direction by a remote control operation of the user (e.g., by using a remote control device). The second electrode panel 133 may be rewound or unwound with the rotation of the roller.

The cases 135a" and 135b" of the rear cover combination unit 135" may be combined with each other by using a fastening member (e.g. including a screw, a rivet, or an adhesive).

The PCB 137" may be electrically connected to flexible PCBs 132a1" and 132b1" of the electrodes 132a" and 132b". The PCB 137" may also be electrically connected to the electrodes 132a" and 132b" via an electric wire (not shown). Additional connectors (not shown) that are connected to the flexible PCBs 132a1" and 132b1" may be positioned on the PCB 137".

A cable 137a" of the PCB 137" may be inserted into an opening 121" of the rear cover 120" through an opening (not shown) of the case 135a". A power may be supplied through the cable 137a" of the PCB 137".

A transparency of the rear cover combination unit 135" may be less than or equal to 50%. The transparency of the rear cover combination unit 135" may be sufficient if the PCB 137" of the rear cover combination unit 135" is invisible.

The second electrode panel 133 that is rewound may have a transparency. The second electrode panel 133 that has the transparency and is rewound may have a light transmittance that is less than or equal to 70%. The second electrode panel 133 that has the transparency and is rewound may also have a light transmittance that is greater than or equal to 20% and less than or equal to 80%.

The second electrode panel 133 that is rewound may include a plate 133" that has a $25^{th}$ transparency and is rewound and a plurality of electrodes 132" that have a $22^{nd}$ transparency. A material of the plate 133" that is rewound may include plastic or fabric. The material of the plate 133" that is rewound may be a material that is sufficient to be rewound on the roller (not shown) of the rear cover combination unit 135".

The plurality of electrodes 132" may be the same as the electrodes 132" of the first electrode panel 130" (or may form a single body with the electrodes 132" of the first electrode panel 130") and may extend from the first electrode panel 130".

The transparency of the second electrode panel 133 that is rewound may be determined by the plate 133a that has a $25^{th}$ transparency and is rewound. The transparency of the second electrode panel 133 that is rewound may also be determined by the plate 133a that has the $25^{th}$ transparency and is rewound and the plurality of electrodes 132a" and 132b" that have the $22^{nd}$ transparency. The transparency of the second electrode panel 133 that is rewound may be equal to or different from the $25^{th}$ transparency of the plate 133a that is rewound (e.g., a light transmittance difference may be less than or equal to ±25%). The transparency of the second electrode 133 that is rewound may be equal to or different from the $22^{nd}$ transparency of the plurality of electrodes 132a" and 132b" (e.g., a light transmittance difference may be less than or equal to ±25%).

The transparency of the second electrode panel 133 that is rewound may be equal to or different from transparencies of the plurality of electrodes 132a" and 132b" (e.g., a $22^{nd}$a transparency, a $22^{nd}$b transparency, a transparency higher than or equal to the transparency, and the like). The $25^{th}$ transparency of the plate 133a of the second electrode panel 133 that is rewound may be equal to or different from the $22^{nd}$ transparency of the electrodes 132a" and 132b" (e.g., a light transmittance difference may be less than or equal to ±25%).

The second electrode panel 133 that is rewound is not seen in front of the display apparatus 100" (e.g., from a positive y-axis direction). If the user is positioned in front of the display apparatus 100" (e.g., in the positive y-axis direction), it is difficult for the user to check the second electrode panel 133 that is positioned at the rear cover 120" of the display apparatus 100".

The electrodes 132" that have the $22^{nd}$ transparency may be supported by (or housed in) the plate 133a that has the $25^{th}$ transparency and is rewound. The plurality of electrodes 132a" and 132b" may transmit a power, which is transmitted through a power cord 10", to the PCB 137" of the rear cover combination unit 135".

The electrodes 132" may be realized as thin films of film shapes. The electrodes 132a" and 132b" that are realized as thin films may be a current line and a ground, respectively.

The electrodes 132" may be realized on the plate 133a according to deposition (or vacuum evaporation), adhesion, or coating so as to have the $22^{nd}$ transparency. The electrodes 132" may be realized by a method such as ITO, silver nanowire, FTO, metal mesh, or the like.

The electrodes 132" may have a $22^{nd}$a transparency (corresponding to the electrode 132a") and a $22^{nd}$b transparency (corresponding to the electrode 132b") according to the number of electrodes. The $22^{nd}$a transparency (corresponding to the electrode 132a") may be equal to or different from the $22^{nd}$b transparency (corresponding to the electrode 132b").

A conductivity of the electrodes 132" is lower than a conductivity of copper. Widths of the electrodes 132" (e.g., greater than or equal to 10 mm and less than or equal to 100 mm) are considerably larger than thicknesses of the electrodes 132" (e.g., less than or equal to 3 mm and greater than or equal to 3 µm) by the low conductivity (e.g., width>>thickness). Widths of the electrodes 132*a*" and 132*b*" are smaller than a width of the plate 133*a* that is rewound (e.g., lower than or equal to 49% of widths of the plates 131" and 133").

The electrodes 132" may be positioned between the plate 133*a* that is rewound and the plate 133*b* that is rewound.

The plate 133*b* that is rewound and a film (not shown) or coating (not shown) may be positioned on front surfaces of the electrodes 132" on the plate 133*a* that is rewound.

Materials of the plates 133*a* and 133*b* that are rewound, a material of the film (not shown), and a material of the coating (not shown) may be insulator materials that are different from a material of the electrodes 132". The plate 133*b* that is rewound and the plate 133*a* that is rewound may also be flame retardant materials or non-combustible materials.

The transparency of the plate 133" that is rewound may be equal to or different from the transparency of the electrodes 132" (e.g., a light transmittance difference may be less than or equal to ±25%).

The second electrode panel 133 may be connected to the first electrode panel 130*a*". The second electrode panel 133 may be combined with (or joined to) the first electrode panel 130*a*". The plates 133*a* and 133*b* of the second electrode panel 133 that are rewound may be combined with (or joined to) plates 131*a*" and 131*b*" of the first electrode panel 130*a*".

The first electrode panel 130*a*" that is not rewound may have a transparency. The plate 131" may have a transparency. Further, the plurality of electrodes 132*a*" and 132*b*" may have the same transparency or different respective transparencies. The second electrode panel 133 that is rewound may have a transparency. The plate 133" that is rewound may have a transparency. In addition, the plurality of electrodes 132*a*" and 132*b*" may have the same transparency or different respective transparencies.

The first electrode panel 130*a*" that has the transparency and is not rewound may have a light transmittance that is greater than or equal to 80%. The first electrode panel 130*a*" that has the transparency and is not rewound may have a light transmittance that is greater than or equal to 50% and less than or equal to 99%.

The first electrode panel 130*a*" that is not rewound may include the plate 131" that has a $21^{st}$ transparency and the plurality of electrodes 132" that have the $22^{nd}$ transparency. The plurality of electrodes 132" may have transparencies corresponding to the number of electrodes (e.g., a $22^{nd}$a transparency, a $22^{nd}$b transparency, and so forth).

The transparency of the first electrode 130*a*" that is not rewound may be determined by the plate 131" that has the $21^{st}$ transparency and the plurality of electrodes 132" that have the $22^{nd}$ transparency. The transparency of the first electrode 130*a*" that is not rewound may be equal to or different from the $21^{st}$ transparency of the plate 131" (e.g., a light transmittance difference may be less than or equal to ±15%). The transparency of the first electrode panel 130*a*" that is not rewound may be equal to or different from the $22^{nd}$ transparency of the plurality of electrodes 312" (e.g., a light transmittance difference may be less than or equal to ±15%). The transparency of the first electrode panel 130*a*" that is not rewound may also be equal to or different from the transparency of the plurality of electrodes 132" (e.g., the $22^{nd}$a transparency, the $22^{nd}$b transparency, and so forth). The $21^{st}$ transparency of the plate 131" may be equal to or different from the $22^{nd}$ transparency of the electrodes 132" (e.g., a light transmittance difference may be less than or equal to ±15%).

The power cord connection unit 136" may include cases 136*a*" and 136*b*" and a PCB 138". The cases 136*a*" and 136*b*" of the power cord connection unit 136" may be combined with each other by use of a fastening member (e.g., including a screw, a rivet, or an adhesive).

The PCB 138" may be electrically connected to the flexible PCBs 132*a*2" and 132*b*2" of the electrodes 132*a*" and 132*b*". The PCB 138" may also be electrically connected to the electrodes 132*a*" and 132*b*" via an electric wire (not shown).

Additional connectors (not shown) that are connected to the flexible PCBs 132*a*2" and 132*b*2" may be positioned on the PCB 138". An external power may be supplied by a combination of the power cord 10" and a power jack 138*a*" of the PCB 138".

A transparency of the power cord connection unit 136" may be less than or equal to 50%. The transparency of the power cord connection unit 136" may be sufficient if the PCB 138" of the power cord connection unit 136" is invisible.

An area of the plate 131" of the first electrode panel 130*a*" may be equal to or different from an area of the plate 133" of the second electrode panel 133. An area of the plate 133*b* that is rewound may be equal to or smaller than an area of the plate 131*b*". An area of the plate 133*a* that is rewound may be equal to smaller than an area of the plate 131*a*".

Figure 5A:
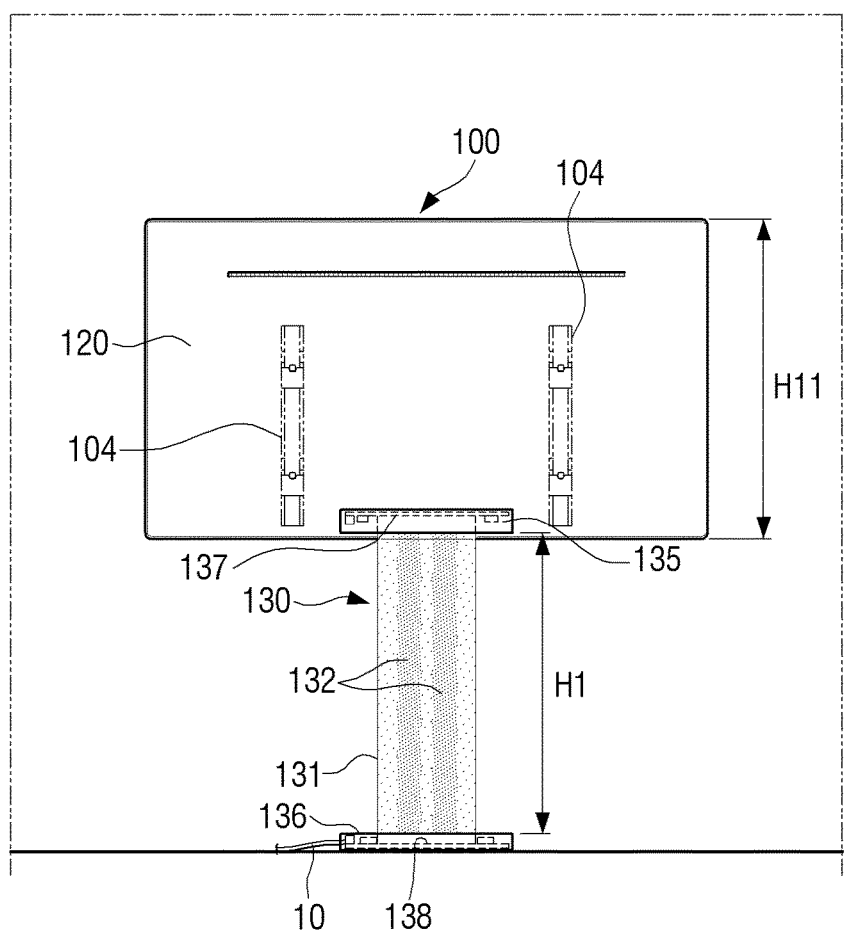
FIG. 5A is a schematic rear view illustrating a display apparatus and an electrode panel that are combined with each other, according to an exemplary embodiment.

FIG. 5A is a schematic rear view illustrating a display apparatus and an electrode panel that are combined with each other, according to an exemplary embodiment.

Referring to FIG. 5A, a rear cover combination unit 135 that includes a PCB 137 is combined with a lower end of a rear cover 120 of a display apparatus 100. The PCB 137 may be electrically connected to electrodes 132. A power may be supplied to the display apparatus 100 through a power cord 10, a PCB 138 of a power cord connection unit 136, and the electrodes 132.

A height H11 of the display apparatus 100 varies based on a screen size (e.g., in response to a diagonal size of a display panel 170). A height H1 of an electrode panel 130 may vary based on an installation height of the wall-mountable type display apparatus 100 (e.g., a height of a wall mount from a floor surface). As the installation height of the wall-mountable type display apparatus 100 becomes higher, the height H1 of the electrode panel 130 may become higher (or increase).

The electrode panel 130 that has various heights according to the installation height of the wall-mountable type display apparatus 100 may be combined with the rear cover combination unit 135 and the power cord connection unit 136. For example, the height H1 of the electrode panel 130 if the installation height of the wall-mountable type display apparatus 100 is 70 cm may be higher than the height H1 of the electrode panel 130 if the installation height of the wall-mountable type display apparatus 100 is 40 cm.

Figure 5B:
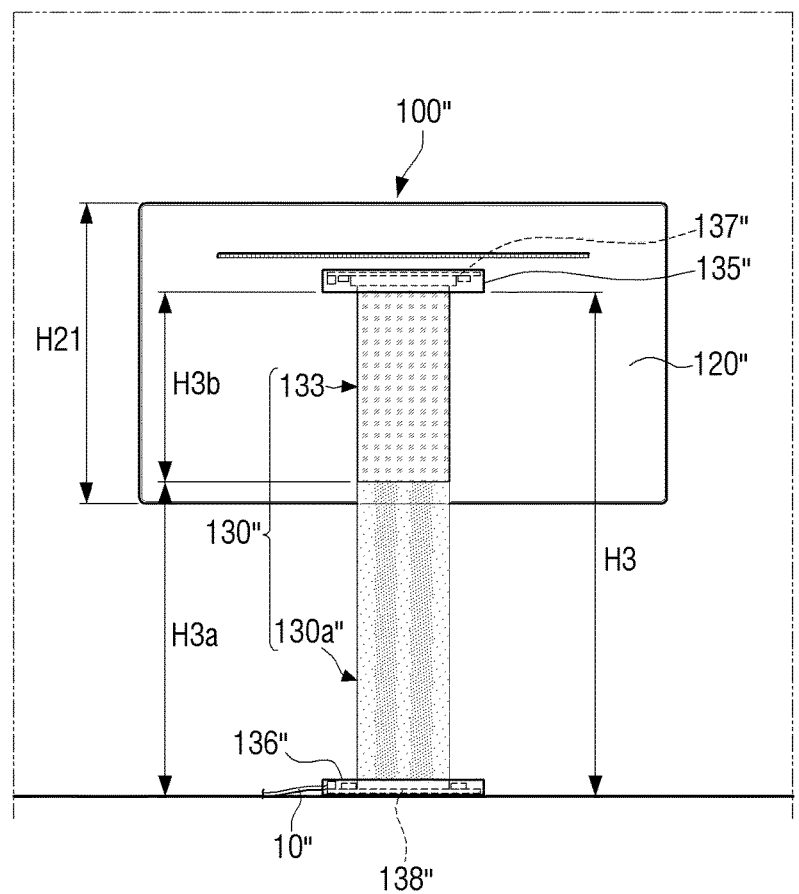
FIG. 5B is a schematic rear view illustrating a display apparatus and an electrode panel that are combined with each other, according to another exemplary embodiment.

FIG. 5B is a schematic rear view illustrating a display apparatus and an electrode panel that are combined with each other, according to another exemplary embodiment.

Referring to FIG. 5B, a rear cover combination unit 135" that includes a PCB 137" may be combined with an upper end of a rear cover 120" of a display apparatus 100". The PCB 137" may be electrically connected to electrodes 132" of an electrode panel 130" that has a plurality of regions. A power may be supplied to the display apparatus 100" through a power cord 10", a PCB 138" of a power cord connection unit 136", and the electrodes 132".

A height H21 of the display apparatus 100" varies based on a screen size (e.g., in response to a diagonal size of a display panel 170"). A height H3 of the electrode panel 130" may vary based on an installation height of the wall-mountable type display apparatus 100" (e.g., a height of a wall mount). As the installation height of the wall-mountable type display apparatus 100" becomes higher, the height H3 of the electrode panel 130" may become higher (or increase).

The electrode panel 130" that has various heights according to the installation height of the wall-mountable type display apparatus 100" and has a second electrode panel 133 that is rewound may be combined with the rear cover combination unit 135". A first electrode panel 130a" may have a fixed height, and a height of the second electrode panel 133 that is rewound may vary based on the installation height of the wall-mountable display apparatus 100" that varies based on a length (or a height) of the second electrode panel 133 rewound on a roller of the rear cover combination unit 135. For example, if the installation height of the wall-mountable type display apparatus 100" is 70 cm, a height H3a of the first electrode panel 130a" may be fixed (e.g., 60 cm), and a height H3b of the second electrode panel 133 that is rewound may vary based on a height of the display apparatus 100".

Figure 6:
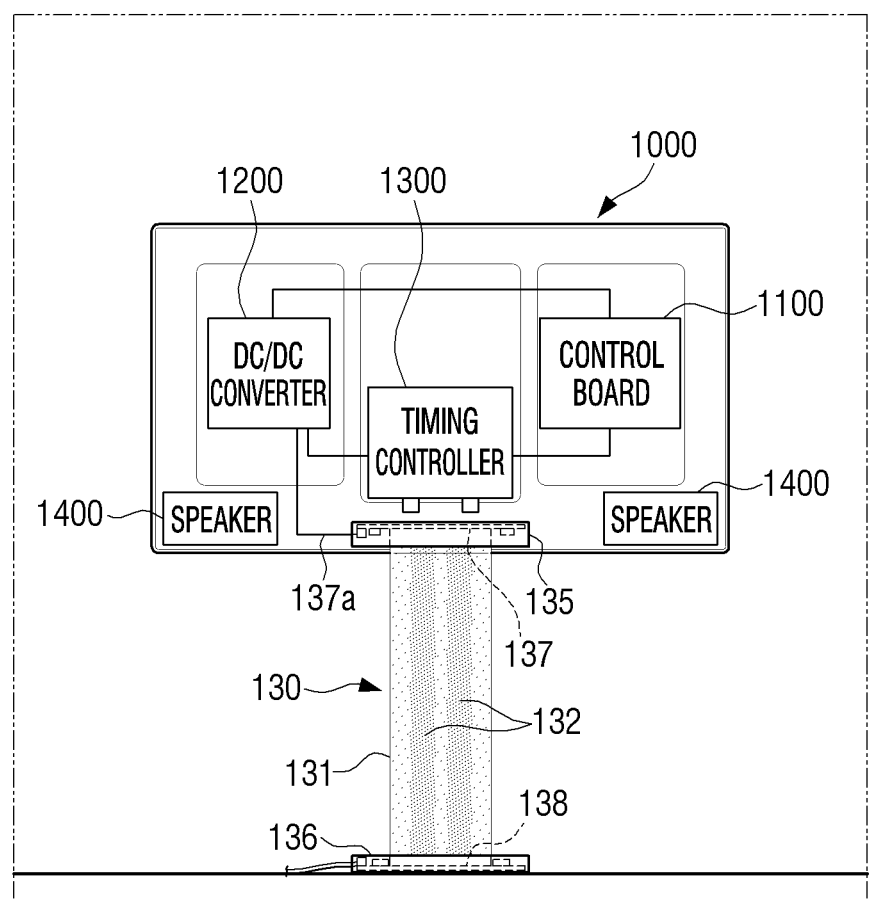
FIG. 6 is a schematic block diagram illustrating a display apparatus, according to an exemplary embodiment.

FIG. 6 is a schematic block diagram illustrating a display apparatus, according to an exemplary embodiment.

Referring to FIGS. 6 and 1A, a display apparatus 1000 may include a bottom chassis (not shown), a light source (not shown), a reflective sheet (not shown), a middle holder (not shown), an optical sheet (not shown), a middle mold (not shown), the display panel 170 (referring to FIG. 1), and the top chassis 180 (referring to FIG. 1). Some of the above-described elements of the display apparatus 1000 may be added, changed, and eliminated.

A PCB 1300 that generates a driving signal for driving the display panel 170 may be positioned on a rear side of the display panel 170. The display panel 170 and the PCB 1300 may be electrically connected to each other through a chip-on film (not shown). The PCB 1300 may be referred to as a timing controller.

The PCB 1300 may be electrically connected to a control board 1100. The PCB 1300 may be controlled by the control board 1100, which includes a processor (not shown).

The control board 1100 may respectively control elements 1100, 1200, 1300, and 1400 of the display apparatus 1000. The control board 1100 may include a memory (e.g., including a volatile memory or a nonvolatile memory) and a communication unit (e.g., including a local area network (LAN) such as wireless fidelity (Wi-Fi), Bluetooth, or the like).

A direct current (DC) power may be supplied to a DC/DC converter 1200 through a cable 137a connected from a PCB 137 of a rear cover combination unit 135. A DC power may be supplied to the PCB 137 of the rear cover combination unit 135 through the power cord 10. The DC power supplied through the power cord 10 may be converted by an additional alternating current AC/DC converter (not shown). The DC/DC converter 1200 may be referred to as a power supply unit. The power supply unit may enable a DC/DC conversion and an AC/DC conversion. The DC power converted by the DC/DC converter 1200 may be supplied to the elements 1100, 1200, 1300, and 1400 of the display apparatus 1000. In another exemplary embodiment, if an AC power is supplied to the PCB 137 of the rear cover combination unit 135, the DC/DC converter 1200 may convert the AC power into a DC power.

A display apparatus according to an exemplary embodiment may include a display body, a wall mount that is connected to a rear cover that is disposed on a rear side of the display body so as to support the display body on a wall, and an electrode unit that is combined with the rear cover so as to supply a power. Some parts of the electrode unit may have light transmittances that are greater than or equal to 50%.

According to an aspect of one or more exemplary embodiments, the electrode unit may include a rear cover combination unit that is combined with the rear cover, an electrode panel that is combined with the rear cover combination unit, and a power cord connection unit that is combined with the electrode panel.

According to an aspect of one or more exemplary embodiments, the power cord connection unit may be electrically connected to a power cord that supplies one of external DC power and external AC power.

According to an aspect of one or more exemplary embodiments, the power cord connection unit may include a first PCB that supplies a DC power to the electrode panel.

According to an aspect of one or more exemplary embodiments, a light transmittance of the power cord connection unit may be less than or equal to 50%.

According to an aspect of one or more exemplary embodiments, the electrode panel may include electrodes, and light transmittances of the electrodes may be greater than or equal to 80%.

According to an aspect of one or more exemplary embodiments, thicknesses of the electrodes that are thin films may be less than or equal to 10% of widths of the electrodes.

According to an aspect of one or more exemplary embodiments, the number of the electrodes may be a plural number, and one of the plurality of electrodes may include a ground.

According to an aspect of one or more exemplary embodiments, the electrode panel may include a plate that supports the electrodes, and a difference between a light transmittance of the plate formed of an insulator material and a light transmittance of the electrodes may be less than or equal to ±15%.

According to an aspect of one or more exemplary embodiments, the rear cover combination unit may include a second PCB that supplies a DC power, which is supplied from the electrode panel, to the display body.

According to an aspect of one or more exemplary embodiments, at least one of the rear cover combination unit and the power cord connection unit may be combined with one of the electrodes and flexible PCBs of the electrode panel and an electric wire.

According to an aspect of one or more exemplary embodiments, a height of the electrode panel may vary based on an installation height of the display apparatus.

A display apparatus according to another exemplary embodiment may include a display body, a stand that is combined with a bottom surface of the display body so as to support the display body, and an electrode unit that is combined with a rear cover that is a rear side of the display body so as to supply a power. Some parts of the electrode unit may have light transmittances that are greater than or equal to 50%.

According to an aspect of one or more exemplary embodiments, a height of the electrode unit that supplies a power to the display body combined with the stand may be less than a height of the electrode unit that supplies a power to the display body combined with a wall mount.

A display apparatus according to another exemplary embodiment may include a display body, a wall mount that is connected to a rear cover that is a rear side of the display body so as to support the display body on a wall, and an electrode unit that includes an electrode panel that is divided into a plurality of regions and is combined with the rear cover so as to supply a power. The electrode panel may have a light transmittance that is greater than or equal to 80%.

According to an aspect of one or more exemplary embodiments, the plurality of regions of the electrode panel may include a first electrode panel that is not rewound and a second electrode panel that is rewound. The first electrode panel and the second electrode panel may be electrically connected to each other.

According to an aspect of one or more exemplary embodiments, the first electrode panel may include a first electrode, and the second electrode panel may include a second electrode. The first electrode and the second electrode may form a single body.

According to an aspect of one or more exemplary embodiments, the electrode unit may include a power cord connection unit that is combined with an external power cord and may be electrically connected to the first electrode panel and a first PCB of the power cord connection unit.

According to an aspect of one or more exemplary embodiments, the rear cover combination unit may include a roller, the second electrode panel may be rewound on the roller, and a height of the second electrode panel may be changed according to rewinding of the second electrode panel.

According to an aspect of one or more exemplary embodiments, the electrode unit may include a rear cover combination unit that is combined with the rear cover, and the first electrode panel may be electrically connected to a first PCB of the rear cover combination unit.

The foregoing exemplary embodiments and advantages are merely exemplary and are not to be construed as limiting the present inventive concept. The present teaching can be readily applied to other types of apparatuses. Also, the description of the exemplary embodiments of the present inventive concept is intended to be illustrative, and not to limit the scope of the claims, and many alternatives, modifications, and variations will be apparent to persons having ordinary skill in the art.

What is claimed is:

1. A display apparatus comprising:
a display body;
a wall mount configured to connect to a rear cover, which is disposed on a rear side of the display body, so as to support the display body on a wall; and
an electrode section configured to couple with the rear cover so as to supply a power,
wherein the electrode section comprises:
   a rear cover combination portion configured to couple with the rear cover,
   an electrode panel configured to couple with the rear cover combination portion and to include two or more regions having different transparencies, and
   a power cord connection portion configured to couple with the electrode panel,
wherein at least one part of the electrode section has a light transmittance that is greater than or equal to 50%.

2. The display apparatus of claim 1, wherein the power cord connection portion is electrically connected to a power cord configured to supply one from among an external direct current (DC) power and an external alternating current (AC) power.

3. The display apparatus of claim 1, wherein the power cord connection portion comprises a first printed circuit board (PCB) configured to supply a direct current (DC) power to the electrode panel.

4. The display apparatus of claim 3, wherein the rear cover combination portion comprises a second PCB configured to supply the display body with the DC power supplied from the electrode panel.

5. The display apparatus of claim 1, wherein a light transmittance of the power cord connection portion is less than or equal to 50%.

6. The display apparatus of claim 1, wherein the electrode panel comprises electrodes,
wherein a light transmittance of each of the electrodes is greater than or equal to 80%.

7. The display apparatus of claim 6, wherein a thickness of each respective one of the electrodes that is a thin film is less than or equal to 10% of a width of the each respective one of the electrodes.

8. The display apparatus of claim 6, wherein one of the electrodes comprises a ground.

9. The display apparatus of claim 6, wherein the electrode panel comprises a plate configured to support the electrodes,
wherein a difference between a light transmittance of the plate formed of an insulator material and a light transmittance of each respective one of the electrodes is less than or equal to ±15%.

10. The display apparatus of claim 1, wherein at least one from among the rear cover combination portion and the power cord connection portion is further configured to couple with at least one from among an electrode and a flexible printed circuit board (PCB) of the electrode panel and an electric wire.

11. The display apparatus of claim 1, wherein a height of the electrode panel varies based on an installation height of the display apparatus.

12. The display apparatus of claim 1, wherein the electrode panel comprises electrodes and a plate configured to support the electrodes, and
at least one of the electrodes has a light transmittance equal to or greater than a light transmittance of the plate.

13. A display apparatus comprising:
a display body;
a stand configured to couple with a bottom surface of the display body so as to support the display body; and
an electrode section configured to couple with a rear cover, which is disposed on a rear side of the display body, so as to supply a power,
wherein the electrode section comprises:
   a rear cover combination portion configured to couple with the rear cover,
   an electrode panel configured to couple with the rear cover combination portion and to include two or more regions having different transparencies, and
   a power cord connection portion configured to couple with the electrode panel,
wherein at least one part of the electrode section has a light transmittance that is greater than or equal to 50%.

14. The display apparatus of claim 13, wherein a height of the electrode section supplying the power to the display body coupled with the stand is lower than a height of the electrode section supplying the power to the display body coupled with a wall mount.

15. A display apparatus comprising:
a display body;
a wall mount configured to couple with a rear cover, which is disposed on a rear side of the display body, so as to support the display body on a wall; and
an electrode section configured to couple with the rear cover so as to supply a power, wherein the electrode section comprises:
a rear cover combination portion configured to couple with the rear cover,
an electrode panel configured to couple with the rear cover combination portion and to include, two or more regions having different transparencies, and
a power cord connection portion configured to couple with the electrode panel,
wherein the electrode panel has a light transmittance that is greater than or equal to 80%.

16. The display apparatus of claim 15, wherein the two or more regions of the electrode panel comprise a first electrode panel configured to be not rewound and a second electrode panel configured to be rewound,
wherein the first electrode panel is electrically connected to the second electrode panel.

17. The display apparatus of claim 16, wherein the first electrode panel comprises a first electrode, and the second electrode panel comprises a second electrode,
wherein the first electrode and the second electrode form a single body.

18. The display apparatus of claim 16, wherein the first electrode panel is electrically connected to a first printed circuit board (PCB) of the power cord connection portion.

19. The display apparatus of claim 16, wherein the rear cover combination portion comprises a roller,
the second electrode panel is rewound on the roller, and
a height of the second electrode panel varies based on a rewinding of the second electrode panel.

20. The display apparatus of claim 16, wherein the first electrode panel is electrically connected to a first printed circuit board (PCB) of the rear cover combination portion.

* * * * *